US012733136B2

(12) United States Patent
Skalski et al.

(10) Patent No.: US 12,733,136 B2
(45) Date of Patent: Sep. 8, 2026

(54) ELECTRIFIED VEHICLE INVERTER POWER MODULE COOLING

(71) Applicant: Ford Global Technologies, LLC, Dearborn, MI (US)

(72) Inventors: Vincent T. Skalski, Plymouth, MI (US); Brian Christian Orr, Macomb, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 439 days.

(21) Appl. No.: 18/313,284

(22) Filed: May 5, 2023

(65) Prior Publication Data

US 2024/0373598 A1 Nov. 7, 2024

(51) Int. Cl.

| | |
|---|---|
| ***H05K 7/20*** | (2006.01) |
| ***B60K 11/02*** | (2006.01) |
| ***B60L 50/60*** | (2019.01) |
| ***H02M 7/00*** | (2006.01) |

(52) U.S. Cl.

CPC ............ *H05K 7/2089* (2013.01); *B60K 11/02* (2013.01); *B60L 50/60* (2019.02); *H02M 7/003* (2013.01); *B60L 2210/40* (2013.01)

(58) Field of Classification Search

CPC .. H05K 7/2089; H05K 7/20927; B60L 50/60; B60L 2210/40; B60K 11/02; H02M 7/003; H01L 23/473

USPC .......................................................... 361/689

See application file for complete search history.

(56) References Cited

U.S. PATENT DOCUMENTS

| | | | | |
|---|---|---|---|---|
| 6,892,796 | B1 | 5/2005 | Nagashima et al. | |
| 7,911,792 | B2 | 3/2011 | Liang et al. | |
| 8,208,258 | B2 | 6/2012 | Campbell et al. | |
| 9,443,786 | B1 | 9/2016 | Rippel et al. | |
| 9,941,234 | B2 | 4/2018 | Liang | |
| 10,017,073 | B2 * | 7/2018 | Lei | B60L 50/61 |
| 10,377,217 | B1 | 8/2019 | Pradeepkumar et al. | |
| 10,707,771 | B1 | 7/2020 | Chen et al. | |
| 2009/0321924 | A1 * | 12/2009 | Funakoshi | H01L 23/4735 257/722 |
| 2016/0309614 | A1 * | 10/2016 | Kikuchi | H05K 7/2089 |

(Continued)

FOREIGN PATENT DOCUMENTS

JP 2011109740 A * 6/2011 ..... H01L 2924/0002

*Primary Examiner* — Mandeep S Buttar
*Assistant Examiner* — Kyle Oxenknecht
(74) *Attorney, Agent, or Firm* — David B. Kelley; Brooks Kushman P.C.

(57) ABSTRACT

An inverter power module cooling system for an electrified vehicle includes an inlet coupled to channels providing coolant from a heat exchanger in parallel to a plurality of power modules along a first edge of associated chips having one or more switches, and channels collecting coolant from a second edge of associated chips. An additional serpentine channel receives coolant from the inlet to cool an associated area of a thermally conductive capacitor pad. The system may include a base plate having channels on one side and providing coolant to one side of the power modules and the capacitor pad, and a channel plate secured to an opposite side of the base plate to provide coolant to an opposite of the power modules. Cover plates may be provided to seal the channels of the base plate and channel plate, or may be integrally formed by molding or additive manufacturing.

16 Claims, 6 Drawing Sheets

(56) References Cited

U.S. PATENT DOCUMENTS

| | | | | |
|---|---|---|---|---|
| 2019/0341327 | A1* | 11/2019 | Teysseyre | H01L 23/3735 |
| 2021/0176901 | A1* | 6/2021 | Hampo | H05K 7/209 |

* cited by examiner 300
310
334
312
360
318

330
334
312
310
316
314

380
310
341
314
334
360
312
316
320
336
370

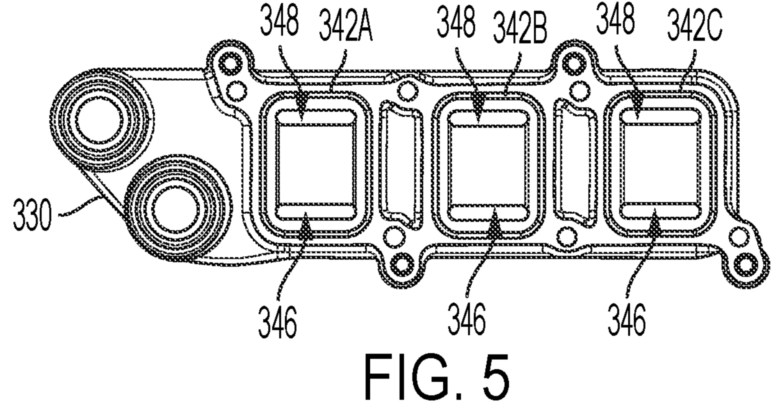
FIG. 5
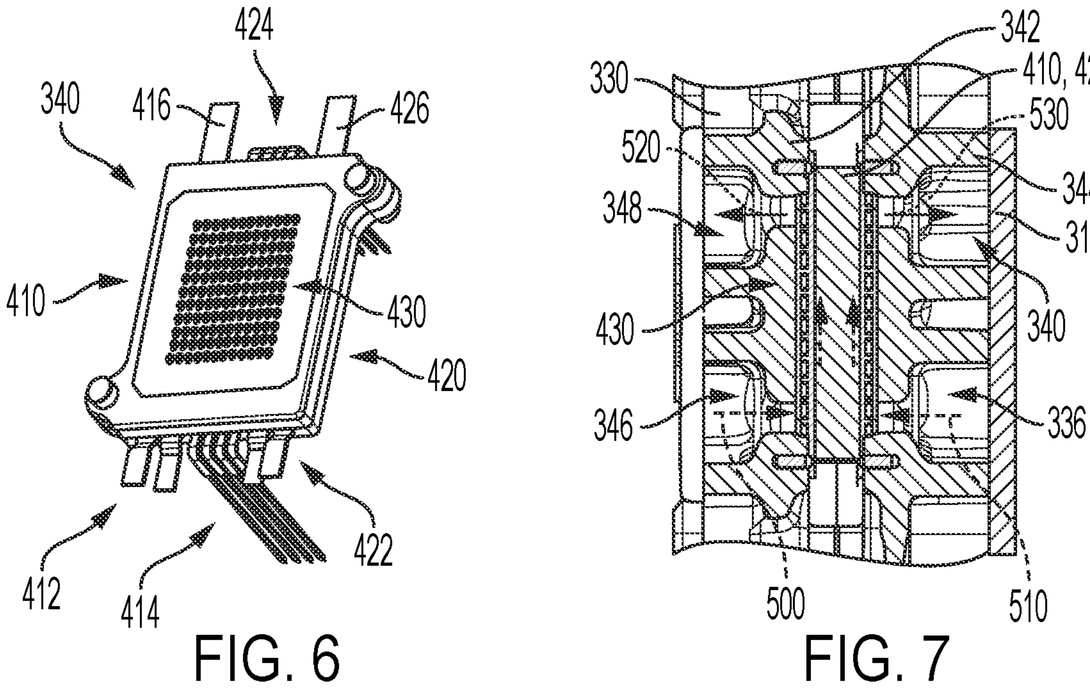
FIG. 6
FIG. 7

ELECTRIFIED VEHICLE INVERTER POWER MODULE COOLING

TECHNICAL FIELD

This disclosure relates to cooling of an electrified vehicle inverter power module.

BACKGROUND

Electrified vehicles such as battery-electric vehicles (BEVs), plug-in-hybrid-electric vehicles (PHEVs) and hybrid electric vehicles (HEVs) include a high voltage traction battery that operates as an energy store for one or more electric machines that provide propulsive torque to vehicle wheels. An inverter is electrically connected between the battery and the electric machines to convert the direct current from the battery into alternating current compatible with the electric machines. The inverter may also act as a rectifier to convert alternating current from the electric machines during regenerative braking or otherwise acting as a generator to direct current compatible with the battery. Various strategies have been developed to provide cooling for the power module of the inverter during operation.

Cooling may be provided to both sides of power modules using a closed cooler, a thermal interface material, and a heavy-duty spring (or other mechanical clamping) to aid conductive heat transfer from the power module assembly to the cooling structure and ultimately to a coolant. The thermal interface material, such as a thermal grease, contributes almost half of the total thermal resistance. While suitable for some applications, the spring increases package size of the power inverter and adds manufacturing complexity to compress the spring during assembly. Other approaches may include a sealed separator plate integrated onto the power module surface to separate the core semiconductor heat-emitting components from the cooling medium.

SUMMARY

In one or more embodiments, an electrified vehicle inverter includes at least one dual-sided power module including a first chip on one side and a second chip on an opposite side each having at least one switch operable by a controller to convert direct current to alternating current. A housing is configured to secure the power module therein and includes a coolant inlet fluidly coupled to a first channel directing coolant from the inlet in parallel across the first and second chips from first respective edges of the first and second chips to opposite respective edges of the first and second chips to a second channel fluidly coupled to a coolant outlet. The housing may include a base plate defining at least a first portion of the first and second channels and configured to secure the at least one power module thereto, and at least one cover plate secured to the base plate, the at least one cover plate configured to fluidly seal the first and second channels. The housing may further include a channel plate defining a second portion of the first and second channels, the channel plate secured to the base plate, the at least one power module being disposed between the channel plate and the base plate, and a second cover plate secured to the channel plate and fluidly sealing the second portion of the first and second channels.

In one or more embodiments, an inverter housing includes a base plate configured to secure at least one power module thereto, a channel plate defining at least a first portion of the first and second channels, the channel plate secured to the base plate, the at least one power module being disposed between the channel plate and the base plate, and a cover plate secured to the channel plate and fluidly sealing the first and second channels. The base plate defines a second portion of the first and second channels, and a third channel having a first end fluidly coupled to the coolant inlet and a second end fluidly coupled to the coolant outlet, the third channel directing coolant over a conductive cooling pad configured to contact an inverter capacitor. The third channel may include a serpentine portion associated with the conductive cooling pad. The housing may also include a base cover plate secured to the base plate and fluidly sealing the third channel and the second portion of the first and second channels.

In various embodiments, the power modules include thermally conductive cooling pins in contact with surfaces of the first and second chips and extending within coolant flow areas between the first and second channels.

Embodiments according to the disclosure may also include an electrified vehicle having a traction battery, an electric machine powered by the traction battery and configured to provide propulsive torque to vehicle wheels, and an inverter electrically coupled to the traction battery and the electric machine, the inverter including a plurality of power modules, each power module including two chips, each chip having at least one switch operable by a controller to convert DC power from the traction battery to AC power supplied to the electric machine, the inverter including a coolant inlet configured to supply coolant in parallel to a first edge of each chip, and a coolant outlet configured to exhaust coolant after flowing from the first edge to a second edge opposite the first edge of each chip. The inverter may include a base plate configured to secure each power module thereto and having a first channel configured to supply coolant from the coolant inlet in parallel to the first edge of each chip and a second channel configured to direct coolant from the second edge of each chip to the coolant outlet. The base plate may include a thermally conductive capacitor plate and a third channel extending from the coolant inlet across the capacitor plate to the coolant outlet. The third channel may include a serpentine portion aligned with the capacitor plate. A base cover plate may extend over the first, second, and third channels to fluidly seal the channels. In various embodiments, a channel plate is secured to the base plate, the channel plate including a lower channel fluidly coupled to the first channel and an upper channel fluidly coupled to the second channel. A channel plate cover is secured to the channel plate and fluidly seals the top and bottom channels.

Embodiments may also include an electrified vehicle system including a traction battery electrically connected to an electric machine by an inverter comprising a base plate having a first channel fluidly coupled to a coolant inlet, a second channel fluidly coupled to a coolant outlet, and a third channel fluidly coupled to the coolant inlet and the coolant outlet, the base plate configured to secure a plurality of power modules each including first and second chips mounted back-to-back and having at least one switch operable by a controller to convert DC power from the traction battery to AC power to the electric machine, the first channel configured to supply coolant in parallel to a first edge of the first chip of each of the plurality of power modules, the second channel configured to collect coolant from a second edge of the first chip of each of the plurality of power modules, a base cover plate extending over the first, second, and third channels and secured to the base plate, a channel plate having a fourth channel fluidly coupled to the coolant inlet and a fifth channel fluidly coupled to the coolant outlet, the fourth channel configured to supply coolant in parallel to a first edge of the second chip of each of the plurality of power modules, the fifth channel configured to collect coolant from a second edge of the second chip of each of the plurality of power modules, and a channel cover plate extending over the fourth and fifth channels. The base plate may include a thermally conductive capacitor pad and the third channel may include a serpentine portion associated with the capacitor pad. The first and second channels may extend from a first surface of the base plate, and the channel plate may be secured to a second surface of the base plate opposite the first surface. Each chip of each power module may contact an associated plurality of thermally conductive pin fins disposed between a respective first edge and second edge of each chip and configured such that coolant flow surrounds the pin fins. Each power module may be mounted to the base plate such that the first chip is on a first side of the base plate and the second chip is on an opposite side of the base plate.

One or more embodiments according to the disclosure may have associated advantages. For example, embodiments may increase heat transfer by providing convective cooling using direct contact with a circulating coolant. Specific discrete cooling channels are provided to supply lower temperature coolant from a heat exchanger in parallel to the surface of each module chip to provide maximum cooling efficiency from the cooling supply. Each module receives direct convective cooling by the lower-temperature coolant from the coolant inlet with the higher-temperature coolant exhaust flow directed to the outlet rather than contacting sequential downstream modules. Elimination of a pressure spring or clamping mechanism and thermal grease associated with various prior art cooling strategies reduces thermal resistance, manufacturing complexity, and package size. The discrete module parallel cooling approach facilitates scaling in two dimensions as compared to a linear stack of modules. Components may also be manufactured using 3D printing/additive manufacturing technology. Those of ordinary skill in the art may recognize additional advantages of one or more embodiments for particular applications or implementations that are not explicitly stated based on the teachings of the disclosure.

BRIEF DESCRIPTION OF THE DRAWINGS

FIG. 5 illustrates the underside of a channel plate in the embodiment of FIGS. 3A-3C.

FIG. 6 illustrates a representative double-sided power module.

FIG. 7 is a cross-section illustrating coolant flow across the double-sided power modules.

DETAILED DESCRIPTION

Figure 1:
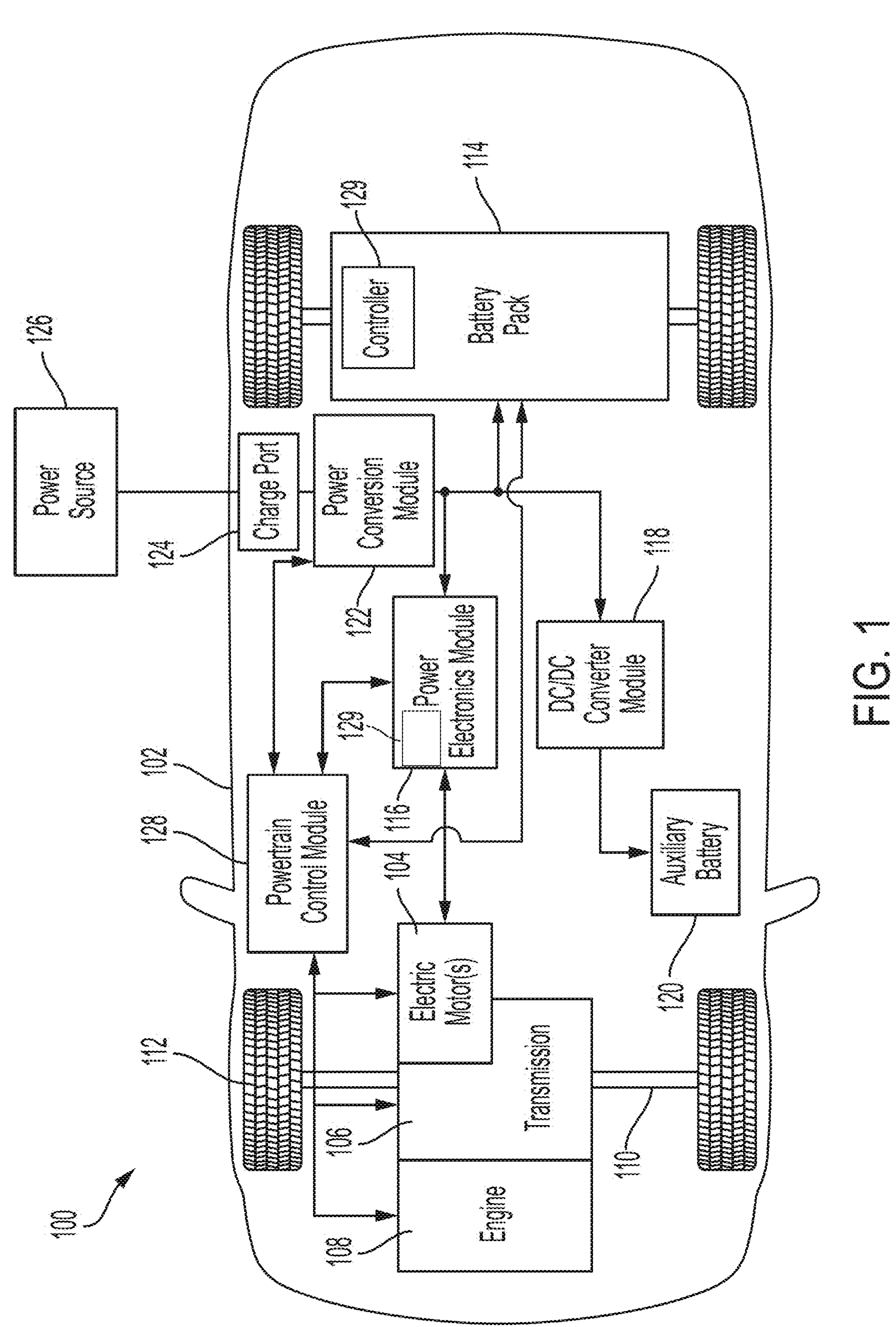
FIG. 1 is a block diagram of an electrified vehicle including an inverter power module with a cooling system according to the disclosure.

As required, detailed embodiments of the claimed subject matter are disclosed herein; however, it is to be understood that the disclosed embodiments are merely representative and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ embodiments of the claimed subject matter.

The present inventors have recognized that convective cooling in combination with conductive cooling can significantly increase the heat transfer from the power module to the coolant. Furthermore, providing specific discrete cooling channels supplying coolant in parallel to multiple power modules according to embodiments of the present disclosure allows each module surface to obtain increased cooling efficiency from the cooling supply.

The inverter cooling design illustrated and described in the present application allows the power module to be convectively cooled by coolant flowing in parallel over both module surfaces of one or more double-sided power modules. Pin fins in contact with at least one side/surface of each chip of the module increase the efficiency of heat transfer (increasing surface area and increasing fluid turbulence) into the cooling medium. Size, spacing, and geometry of the pin fin design may be modified based on desired cooling fluid performance. In the representative embodiments illustrated and described, cooling of three double-sided power card-type modules is provided. However, the representative design and method for assembly are not limited to the particular configuration shown and the design can be scaled in length and/or width depending on the topology, power, and package requirements of the inverter. The power modules may include locating dowels (or other alignment features) integrated into the module housing to facilitate assembly to a manifold. When sealing/bonding the module to the manifold, an acrylic/epoxy seal may be dispensed, or a press-in-place gasket may be used, for example. Thermal bonding may also be used depending on the types of materials that are selected for a particular application and implementation. Additional potting around the signal or power terminals that extend from the power modules may be provided in some applications.

The coolant supplied to convectively cool the module surfaces can be separated per surface (or pairs of surfaces) by using specific discrete circuit supply channels. As such, each surface supply will ensure the maximum heat removal. Each coolant inflow is effectively isolated from, and will not mix with, warmer coolant that has already absorbed heat from another module or capacitor. While a representative supply channel design, profile, or layout is provided, the channel characteristics and layout may vary based on the particular application and implementation. Channel design may utilize 3D printing or additive manufacturing in optimizing the coolant flow, channel material, and package size. The supply channel(s) can also be utilized to cool the capacitor component of the inverter assembly conductively/convectively.

FIG. 1 depicts an example of an electrified vehicle 100 implemented as a plug-in hybrid-electric vehicle. The electrified vehicle 100 may comprise one or more three-phase electric machines 104 mechanically connected to a transmission 106. Transmission 106 is mechanically connected to an engine 108 for hybrid implementations. The transmission 106 may also be mechanically connected to a drive shaft 110 that is mechanically connected to the wheels 112. The electric machines or motor/generators 104 can provide propulsion whether the engine 108 is turned on or off. The electric machines 104 may operate as motors, generators, or both. Electrified vehicle 100 may also be implemented as a battery electric vehicle without an engine 108 and powered solely by traction battery 114 alone or in combination with another power source, such as a fuel cell, for example.

Traction battery or battery pack 114 stores energy that can be used by the electric machines 104. A vehicle battery pack 114 typically provides a high voltage (HV) DC output provided by connecting hundreds of low voltage cells together. The battery pack 114 is electrically connected to a power electronics module 116. The power electronics module 116 is also electrically connected to the electric machines 104 and provides the ability to bi-directionally transfer energy between the battery pack 114 and the electric machines 104. For example, a typical battery pack 114 may provide a DC voltage/current while the electric machines 104 may require a three-phase AC voltage/current. The power electronics module 116 may include an inverter having a power module with switches operable by a controller to convert the DC power from the battery 114 to a three-phase AC power as required by the electric machines 104. Power electronics module 116 may also include a voltage converter that increases the DC voltage from the battery pack 114 supplied to the HV DC bus that powers the inverter of power electronics module 116. In a regenerative mode, the power electronics module 116 will convert the three-phase AC power from the electric machines 104 acting as generators to DC power required to recapture energy in the battery pack 114. Thermal management of the heat generated by the power conversion is provided by cooling of the power stage assembly module of the power electronics module according to one or more embodiments described herein.

In addition to providing energy for propulsion, the battery pack 114 may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V, 24V, or 48V battery 120.

The battery pack 114 may be recharged by an external power source 126. The external power source 126 may provide AC or DC power to the vehicle 102 by electrically connecting through a charge port 124. The charge port 124 may be any type of port configured to transfer power from the external power source 126 to the vehicle 102. The charge port 124 may be electrically connected to a power conversion module 122, sometimes referred to as a charger or charging module. The power conversion module may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric machines, battery, power conversion, power electronics, and various other control modules, components, or systems may be controlled by a controller such as a powertrain control module (PCM) 128. Alternatively, or in combination, various systems or subsystems may include associated control modules or controllers 129 in communication with PCM 128 over a vehicle wired or wireless network to provide coordinated control of the vehicle. As used in this disclosure, a controller generally refers to one or more control modules or controllers that may cooperate to perform a particular task or function and is not limited to a single controller or any particular dedicated controller or control module.

Figure 2:
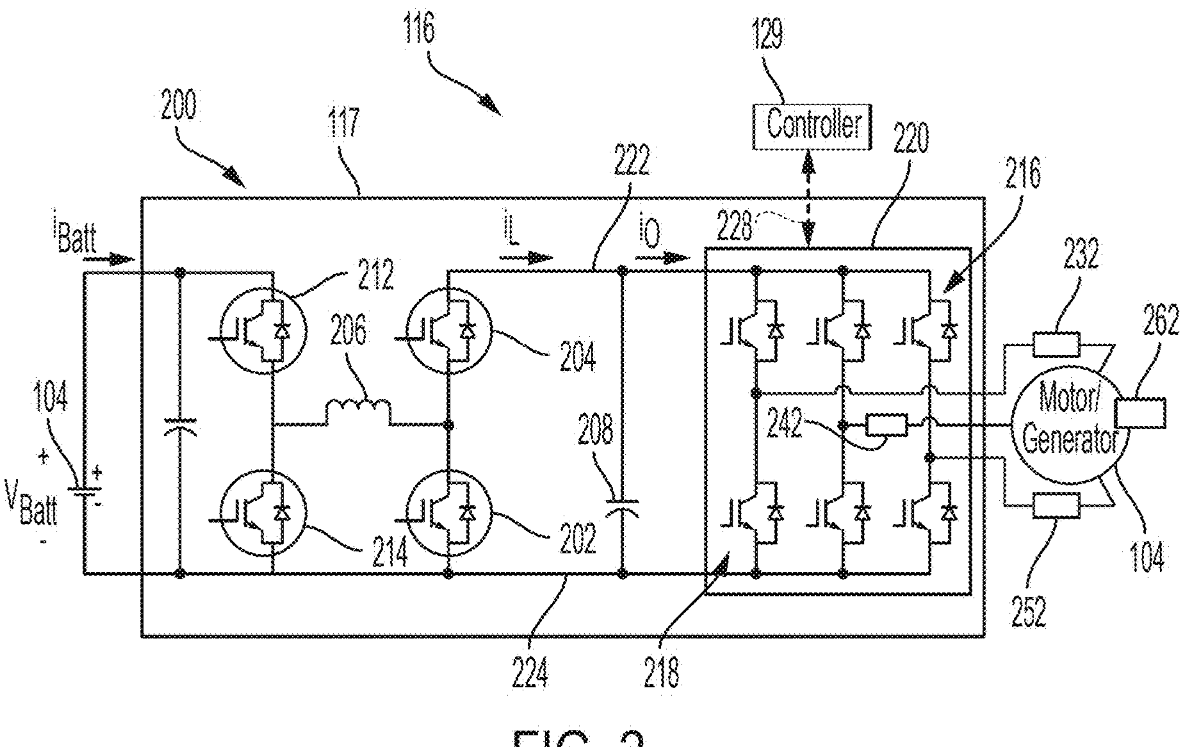
FIG. 2 is a schematic diagram illustrating an inverter power module with a cooling system according to the disclosure connecting an HV traction battery and an electric machine (motor/generator) of an electrified vehicle.

FIG. 2 illustrates a traction battery 114 coupled via a positive leg 222 and negative leg 224 of the HV DC bus to a power electronics module 116, which is connected to a three-phase electric machine 104 in a representative electrified vehicle 100. Power electronics module 116 may include a housing 117 fluidly connected to a vehicle coolant system (not shown) having one or more heat exchangers, pumps, and valves, etc. to circulate a cooling fluid through power electronics module 116 and cool the power stage assembly of inverter 220 and a DC link capacitor 208 as described herein. Inverter 220 may include high voltage switches 216, 218 in one or more power modules implemented by relays, insulated gate bipolar junction transistors (IGBTs), metal oxide semiconductor field effect transistors (MOSFETs), bipolar junction transistors (BJTs), and/or other electro-mechanical or solid-state switches. In various embodiments, the switches are implemented by semiconductor switches of associated semiconductor integrated circuits or chips.

One or more contactors or high voltage switches (not shown) controlled by an associated controller, such as powertrain control module 128, may be operated to selectively connect battery voltage from battery 114 to power electronics module 116 after completing various diagnostic routines in response to a vehicle start. These high voltage switches may also be implemented by relays, insulated gate bipolar junction transistors (IGBTs), metal oxide semiconductor field effect transistors (MOSFETs), bipolar junction transistors (BJTs), and/or other electro-mechanical or solid state switches. The system may include a pre-charge circuit to limit the current flow from battery 114 while the system is powering up.

Power electronics module 116 may include buck-boost converter circuitry 200 upstream of inverter components 220 to drive one or more electric machines 104. The power electronics module 116 may include a boost circuit with an inductor 206, a switch 212 to charge an electric field in the inductor 206, and a switch 214 to discharge the electric field and change the voltage to drive the motor/generator 104. This power electronics module 116 may also include a buck circuit using inductor 206 and switches 202 and 204. This voltage converter circuit will convert the battery voltage to an operational voltage which may be greater than the battery terminal voltage. The buck-boost power converter 200 may use IGBTs, BJTs, MOSFETs, relays, or other electro-mechanical or solid state switches. The use of IGBTs with Fast Recovery Diodes (FRDs) in FIG. 2 is representative and may be accomplished using MOSFETs, BJTs, or other electro-mechanical or solid state switches. One or more capacitors, represented by DC link capacitor 208, may be used to filter the voltage generated by the voltage converter so that the operational voltage applied to the inverter 220 is generally stable, and may be mounted in contact with a thermally conductive capacitor pad cooled by coolant circulating within an associated serpentine channel as described herein. This buck-boost circuit is intended to change the voltage of a high voltage battery 114 (having a voltage greater than 60V DC), to an operating voltage different than the battery voltage. As one example, a traction battery voltage of 90-400 volts may be boosted to an operating voltage of 100-1,200 volts.

As previously described, inverter 220 converts the DC voltage/current to a three-phase AC voltage/current provided to electric machine 104 by controlling operation of upper IBGTs 216 and lower IGBTs 218. As illustrated, each of the three phases of electric machine 104 is connected between an upper/lower pair of transistors, with each transistor pair connected in series across the positive leg 222 and negative leg 224 of the HV DC bus. Inverter 220 may communicate with an associated controller as indicated at 228 to control the switching of upper switches 216 and lower switches 218.

System 200 may include various sensors to monitor and control operation of the inverter 220 and electric machine 104. For example, in various embodiments system 200 may include current sensors 232, 242, 252 associated with each phase of the electric machine 104. Electric machine 104 may include a resolver or other rotational position sensor 262 that provides a corresponding signal indicative of rotational position and rotational speed of the rotor of electric machine 104. The rotational position sensor 262 may be a resolver, encoder, speed sensor, or another position sensor that is associated with the electric machine 104.

Figures 3A, 3B, 3C:
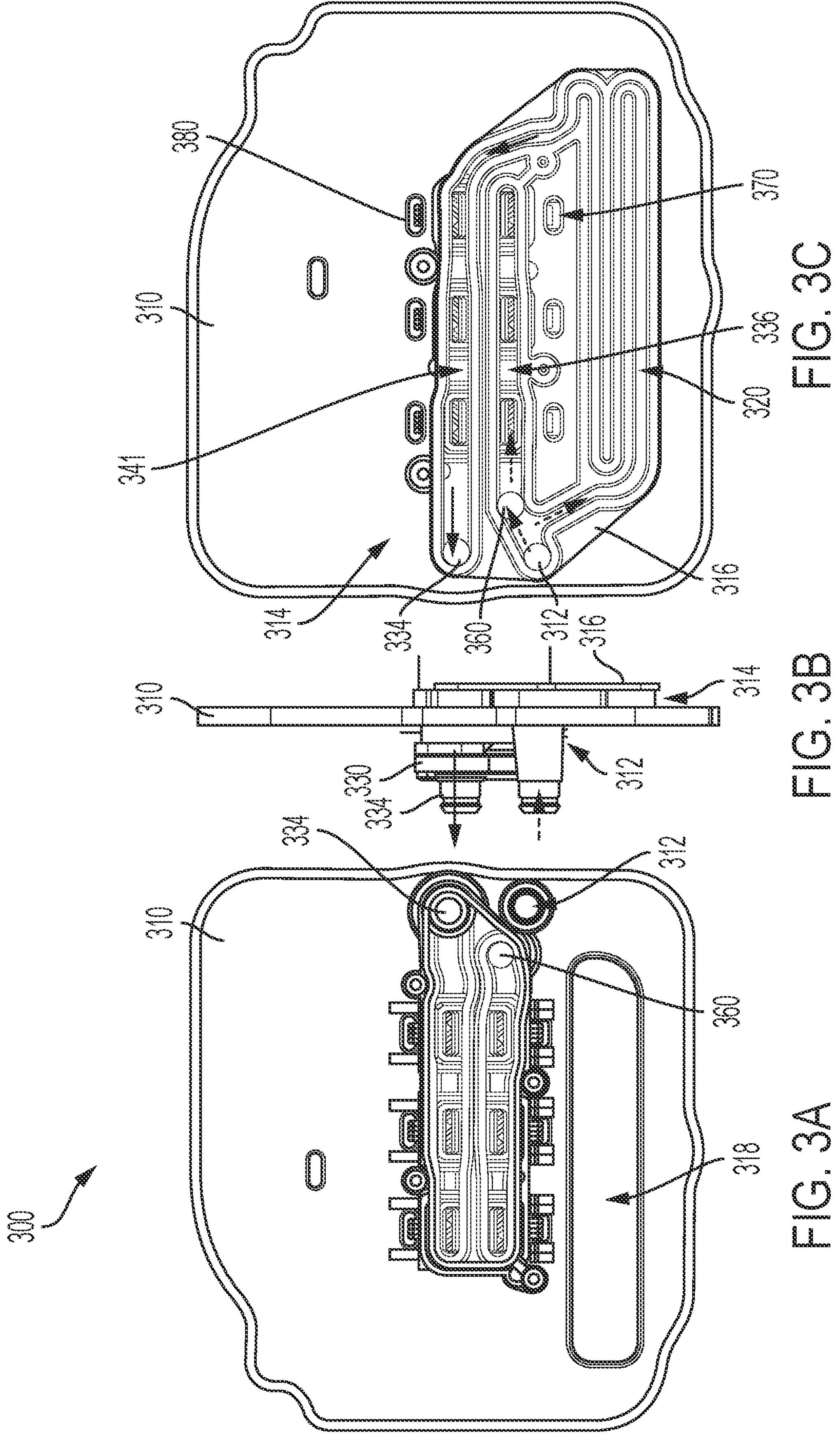
FIG. 3A is a front view of a power stage assembly with cooling according to a representative embodiment.
FIG. 3B is a side view of the embodiment of FIG. 3A.
FIG. 3C is a back view of the embodiment of FIG. 3A.
Figure 4:
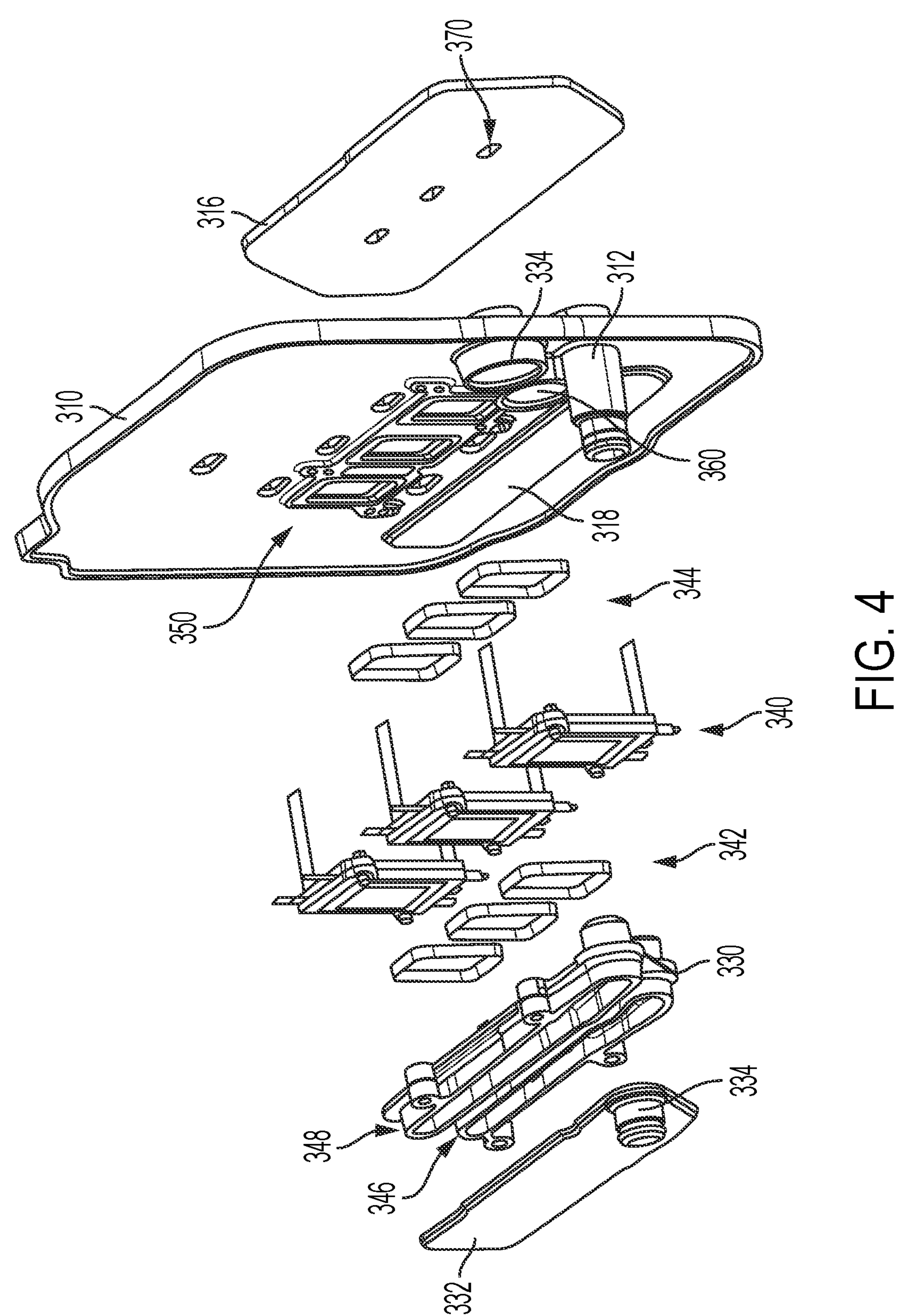
FIG. 4 is a perspective assembly view of the embodiment of FIGS. 3A-3C.

FIGS. 3A, 3B, and 3C illustrate front, side, and back views, respectively, of an electrified vehicle inverter power stage assembly with cooling according to a representative embodiment. FIG. 4 is a perspective assembly view of the embodiment of FIGS. 3A-3C. In the representative embodiment illustrated, power stage assembly 300 includes a base plate 310 having an integral coolant inlet 312 that directs coolant from the front side through base plate 310 to integral coolant channels 314 on the back side with a base cover plate 316 secured to base plate 310 to fluidly seal the coolant channels 314. In one or more embodiments, base cover plate 316 may be omitted and instead integrally formed with the base plate coolant channels 314. Similarly, integral coolant channels 314 may be replaced by a channel plate having a separate or integral channel cover plate with the channel/cover plate secured to base plate 310, similar to channel plate 330 described below. Base cover plate 316 may include one or more openings 370 to accommodate electrical power and control connections to power modules 340.

Base plate 310 includes a thermally conductive capacitor pad 318 having an associated serpentine coolant channel 320 (third channel) fluidly connected to coolant inlet 312 and coolant outlet 334 via a second channel 341 such that coolant from coolant inlet 312 flows back/forth or up/down across one side of thermally conductive capacitor pad 318 to coolant outlet or exhaust 334. One or more capacitors (not shown) may be mounted with a surface in contact with capacitor pad 318 for cooling of the capacitor(s) by coolant flowing through serpentine coolant channel 320.

Integral coolant channels 314 include a first channel 336 fluidly coupled to coolant inlet 312 to deliver coolant from coolant inlet 312 in parallel to a first edge of each integrated circuit chip associated with a plurality of power modules 340 (best illustrated in FIG. 7). After flowing across the plurality of chips, the coolant is directed by second channel 341 to coolant outlet 334. In the illustrated embodiment, second channel 341 is fluidly coupled between the outlet of serpentine channel 320 (third channel) and coolant outlet 334. Channels 314 include a pass-through opening 360 to direct coolant from coolant inlet 312 to the opposite side of channel plate 310 to supply coolant to channel plate 330. Channel plate 330 includes a lower channel 346 (fourth channel) fluidly coupled to (or forming a second portion of) first channel 336 and supplying coolant in parallel to a first edge of the integrated circuit chips of power modules 340, and an upper channel 348 (fifth channel) fluidly coupled to (or forming a second portion of) second channel 341 and coolant outlet 334. The coolant flows in parallel across the surface of at least one integrated circuit chip of power modules 340 between the lower channel 346 and the upper channel 348 as guided by associated seals 342 (best illustrated in FIGS. 5, 7). Seals 344 are positioned on the opposite side of power modules 340 and function in a similar fashion to contain and guide coolant flow from first channel 336 to second channel 341.

FIG. 5 illustrates the underside of channel plate 330 including seals 342A, 342B, and 342C associated with a first side of corresponding power modules 340 to contain coolant flow across a first surface of the power module integrated circuit chips from lower channel 346 to upper channel 348.

FIG. 6 illustrates a representative double-sided power module 340 mounted to the base plate 310. Power module 340 includes a first integrated circuit chip 410 secured or mounted back-to-back with a second integrated circuit chip 420. Each integrated circuit chip may include a plurality of pin fins 430 mounted to the chip surface that are positioned within the coolant flow between the first and second channels to increase heat transfer surface area and fluid turbulence of the coolant. The first integrated circuit chip 410 may include associated electrical power connectors 412, control lines 414, and common/ground connector 416. Similarly, the second integrated circuit chip 420 may include associated electrical power connectors 422, control lines 424, and common/ground connector 426. Each integrated circuit chip 410, 420 of each power module 430 includes at least one solid-state switch operable by a controller to convert DC power from the traction battery to AC power provided to at least one electric machine as previously described.

FIG. 7 is a cross-section illustrating coolant flow across each integrated circuit chip 410, 420 of a double-sided power module 340. Coolant from the inlet flows in parallel to integrated circuit chips 410, 420 via lower channel 346 and first channel 510, respectively as indicated by arrows 500, 510 from a first respective edge of the integrated circuit chips 410, 420 across associated pin fins to an opposite respective edge of the integrated circuit chips 410, 420 before being directed to the coolant outlet via upper channel 348 and second channel 341 as represented by arrows 510, 530, respectively.

Figure 8:
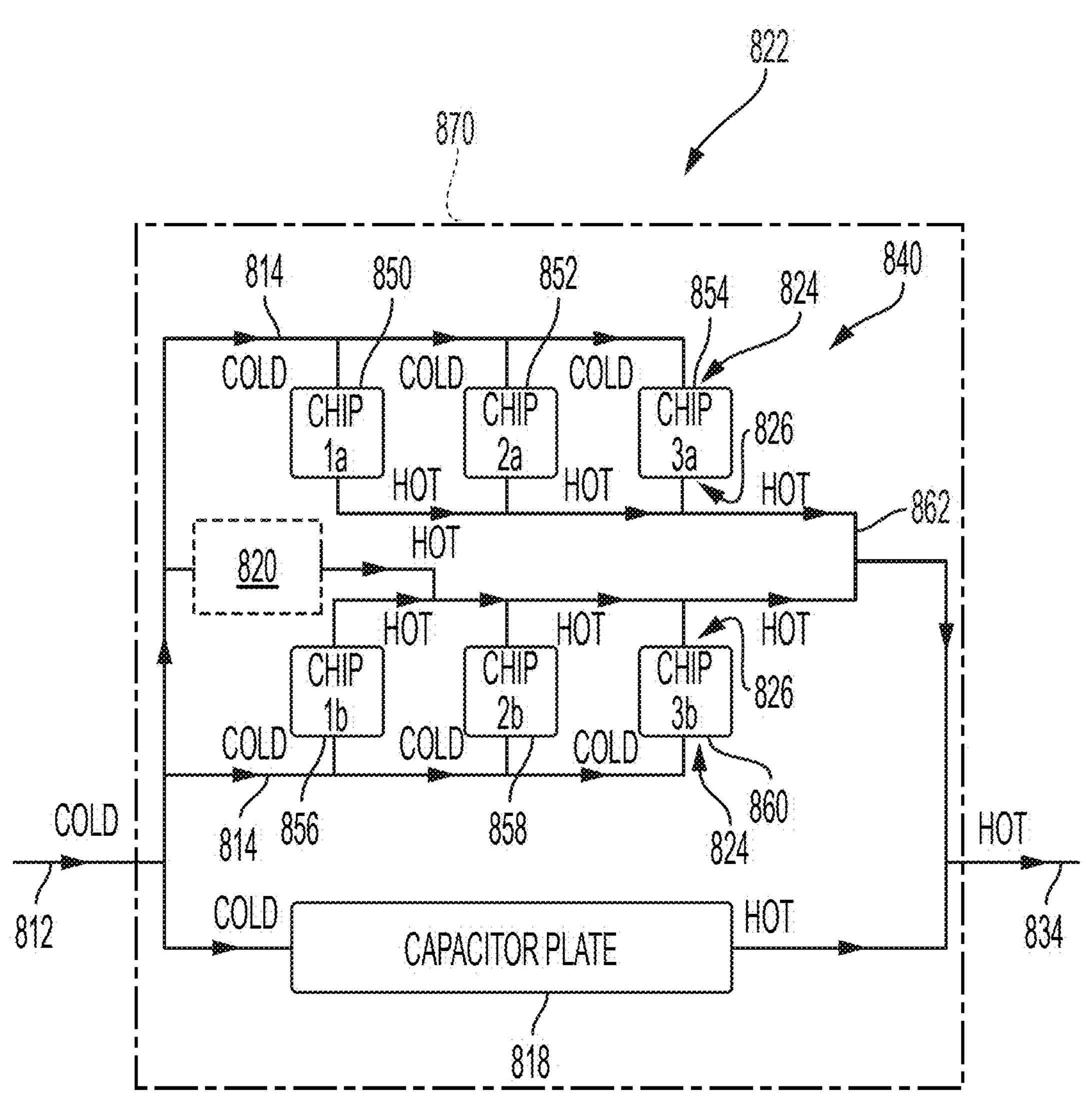
FIG. 8 is a diagram illustrating coolant flow for a representative embodiment of an inverter power module.

FIG. 8 is a diagram illustrating coolant flow for a representative embodiment of an inverter power module. Coolant flows from a vehicle heat exchanger (not shown) through inlet 812 of housing 870 and is distributed by a first channel 814 in parallel to a plurality of power modules 840 and optionally a capacitor plate 818. Block 820 illustrates an alternative position within the fluid circuit for capacitor plate 818. Each power module 840 includes at least one integrated circuit chip 822 having a first edge 824 and an opposite second edge 826. Each integrated circuit chip 822 includes at least one switch controllable to convert DC power from a vehicle traction battery to AC power supplied to at least one electric machine. First channel 814 supplies coolant from inlet 812 in parallel to the first edge 824 of at least two integrated circuit chips, such as chips 850, 852, 854, 856, 858, 860. Coolant flows across at least one surface of each integrated circuit chip from respective first edges 824 to respective second edges 826 and is collected by a second channel 862 and directed to outlet 834 of housing 870, which returns to the vehicle heat exchanger.

In the embodiment illustrated in FIG. 8, coolant from inlet 812 is directed by first channel 814 in parallel to first edges 824 and to capacitor plate 818. However, a separate channel may be provided to supply coolant from inlet 812 to capacitor plate 818 in some applications. Similarly, in one embodiment power modules 840 are implemented by double-sided power modules such that a first power module includes chips 850, 856, a second power module includes chips 852, 858, and a third power module includes chips 854 and 860.

While representative embodiments are described above, it is not intended that these embodiments describe all possible forms of the invention. The words used in the specification are words of description rather than limitation, and it is understood that various changes may be made without departing from the claimed subject matter. Additionally, the features of various implementing embodiments may be combined to form further embodiments within the scope of the claimed subject matter that are not explicitly described or illustrated.

What is claimed is:

1. An electrified vehicle inverter, comprising:

at least one power module including a first chip and a second chip each having at least one switch operable to convert direct current to alternating current; and a housing configured to secure the power module therein, the housing including:

a coolant inlet fluidly coupled to a first channel directing coolant from the inlet in parallel across the first and second chips from first respective edges of the first and second chips to opposite respective edges of the first and second chips to a second channel fluidly coupled to a coolant outlet;

a base plate defining at least a first portion of the first and second channels and configured to secure the at least one power module thereto;

at least one cover plate secured to the base plate, the at least one cover plate configured to fluidly seal the first and second channels;

a channel plate defining a second portion of the first and second channels, the channel plate secured to the base plate, the at least one power module being disposed between the channel plate and the base plate; and a second cover plate secured to the channel plate and fluidly sealing the second portion of the first and second channels.

2. The electrified vehicle inverter of claim 1 wherein the base plate defines a second portion of the first and second channels, and a third channel having a first end fluidly coupled to the coolant inlet and a second end fluidly coupled to the coolant outlet, the third channel directing coolant over a conductive cooling pad configured to contact an inverter capacitor.

3. The electrified vehicle inverter of claim 2 wherein the third channel comprises a serpentine portion associated with the conductive cooling pad.

4. The electrified vehicle inverter of claim 2 further comprising a base cover plate secured to the base plate and fluidly sealing the third channel and the second portion of the first and second channels.

5. The electrified vehicle inverter of claim 1 wherein the at least one power module includes thermally conductive cooling pins in contact with surfaces of the first and second chips and extending within coolant flow areas between the first and second channels.

6. An electrified vehicle system including a traction battery electrically connected to an electric machine by an inverter comprising:

a base plate having a first channel fluidly coupled to a coolant inlet, a second channel fluidly coupled to a coolant outlet, and a third channel fluidly coupled to the coolant inlet and the coolant outlet, the base plate configured to secure a plurality of power modules, each power module including first and second chips mounted back-to-back and having at least one switch operable by a controller to convert DC power from the traction battery to AC power to the electric machine, the first channel configured to supply coolant in parallel to a first edge of the first chip of each of the plurality of power modules, the second channel configured to collect coolant from a second edge of the first chip of each of the plurality of power modules;

a base cover plate extending over the first, second, and third channels and secured to the base plate;

a channel plate having a fourth channel fluidly coupled to the coolant inlet and a fifth channel fluidly coupled to the coolant outlet, the fourth channel configured to supply coolant in parallel to a first edge of the second chip of each of the plurality of power modules, the fifth channel configured to collect coolant from a second edge of the second chip of each of the plurality of power modules; and a channel cover plate extending over the fourth and fifth channels.

7. The electrified vehicle system of claim 6 wherein the base plate includes a thermally conductive capacitor pad and wherein the third channel includes a serpentine portion associated with the capacitor pad.

8. The electrified vehicle system of claim 6 wherein the first and second channels extend from a first surface of the base plate, and the channel plate is secured to a second surface of the base plate opposite the first surface.

9. The electrified vehicle system of claim 6 wherein each chip contacts a plurality of thermally conductive pin fins disposed between a respective first edge and second edge of each chip.

10. The electrified vehicle system of claim 6 wherein each power module is mounted to the base plate such that the first chip is on a first side of the base plate and the second chip is on an opposite side of the base plate.

11. An electrified vehicle inverter, comprising:

a plurality of power modules, each of the plurality of power modules including two chips mounted back-to-back, each chip having at least one switch operable to convert DC power from a traction battery to AC power supplied to an electric machine, the inverter including a coolant inlet configured to supply coolant in parallel to a first edge of all of the chips of the plurality of power modules, and a coolant outlet configured to exhaust coolant after flowing from the first edge to a second edge opposite the first edge of each chip; and a base plate configured to secure each of the plurality of power modules thereto, the base plate having a first channel configured to supply coolant from the coolant inlet in parallel to the first edge of each chip and a second channel configured to direct coolant from the second edge of each chip to the coolant outlet.

12. The electrified vehicle inverter of claim 11 wherein the base plate includes a thermally conductive capacitor plate and a third channel extending from the coolant inlet across the capacitor plate to the coolant outlet.

13. The electrified vehicle inverter of claim 12 wherein the third channel includes a serpentine portion aligned with the capacitor plate.

14. The electrified vehicle inverter of claim 13 further comprising a base cover plate extending over the first, second, and third channels and secured to the base plate, the base cover plate configured to fluidly seal the first, second, and third channels.

15. The electrified vehicle inverter of claim 14 further comprising:

a channel plate secured to the base plate, the channel plate including a lower channel fluidly coupled to the first channel and an upper channel fluidly coupled to the second channel.

16. The electrified vehicle inverter of claim 15 further comprising a channel plate cover secured to the channel plate and fluidly sealing the top and bottom channels.

* * * * *